US007276966B1

(12) United States Patent
Tham et al.

(10) Patent No.: US 7,276,966 B1
(45) Date of Patent: Oct. 2, 2007

(54) RADIO FREQUENCY ENVELOPE APPARATUS AND METHOD

(75) Inventors: Andrew Tham, San Diego, CA (US); Steven R. Norsworthy, Cardiff, CA (US); Jason Rupert Redgrave, Mountain View, CA (US)

(73) Assignee: STMicroelectronics N.V. (NL)

( * ) Notice: Subject to any disclaimer, the term of this patent is extended or adjusted under 35 U.S.C. 154(b) by 393 days.

(21) Appl. No.: 10/978,015

(22) Filed: Oct. 28, 2004
(Under 37 CFR 1.47)

Related U.S. Application Data

(60) Provisional application No. 60/515,377, filed on Oct. 28, 2003.

(51) Int. Cl.
*H03G 3/20* (2006.01)

(52) U.S. Cl. ...................................... 330/136; 330/253

(58) Field of Classification Search ................ 330/136, 330/253, 255, 257, 261
See application file for complete search history.

(56) References Cited

U.S. PATENT DOCUMENTS 6,828,856 B2 * 12/2004 Sanchez et al. ............. 330/253
6,975,168 B2 * 12/2005 Tobita ........................ 330/253
7,183,852 B2 * 2/2007 Abe ........................... 330/257

* cited by examiner

*Primary Examiner*—Henry Choe
(74) *Attorney, Agent, or Firm*—Lisa K. Jorgenson; William A. Munck

(57) ABSTRACT

Improved radio frequency (RF) envelope tracking apparatus for use in wireless and wired systems. In one exemplary embodiment, a transmitter upconversion stage receives input digital I and Q values, the output of the upconversion stage being fed to both an envelope tracking circuit and a power amplifier (before or after optional filtering). The envelope tracking circuit controls the operation of a power modulator, which adjusts the power amplifier. The envelope tracking circuit is specifically configured to provide improved linearity and power efficiency. The envelope tracking apparatus and methods of the present invention may be applied to heterodyne/super-heterodyne architectures as well as others.

23 Claims, 7 Drawing Sheets

120
233
Ic
250
Id
FROM OUTPUT OF CURRENT SWITCH
P
225
Ri
227
232
IP
Mi
230
Mr
VENV
236
TO POWER SUPPLY MODULATOR
VENV
VP
228
VN
VC
242
Md
Vsup
VP
229
VN
M1
240
d
M2
C1
260

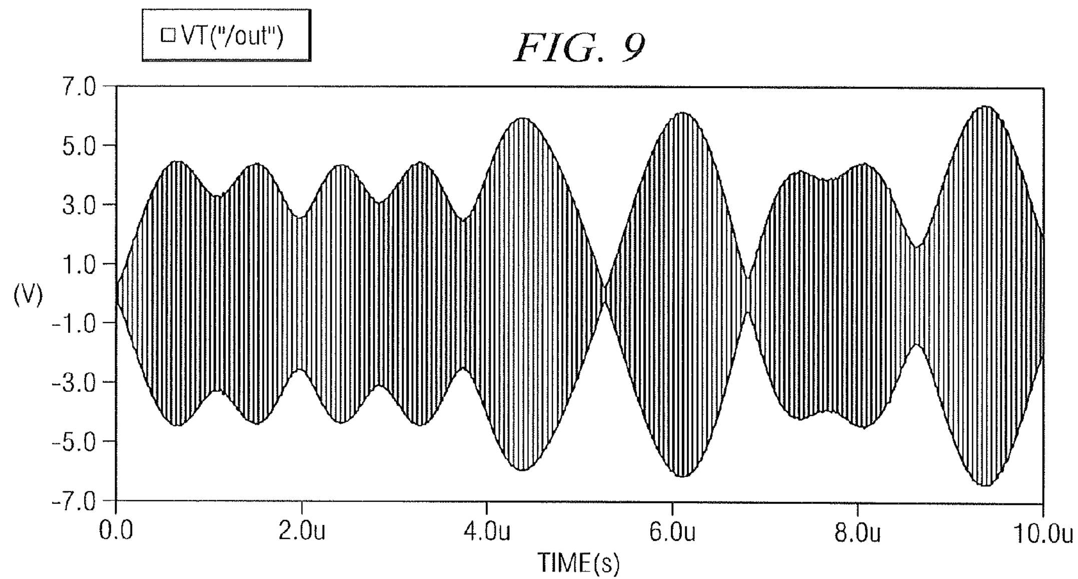
*FIG. 9*
*FIG. 10*
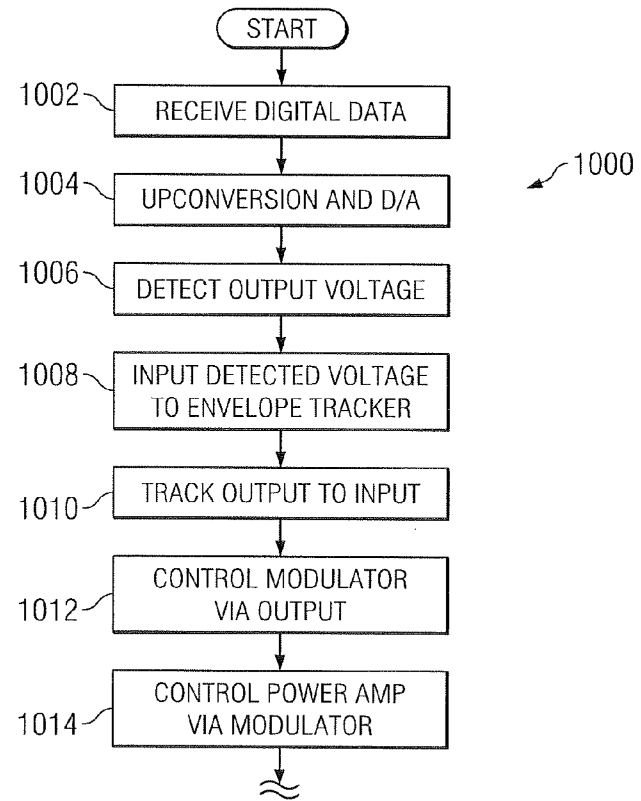

RADIO FREQUENCY ENVELOPE APPARATUS AND METHOD

PRIORITY AND RELATED APPLICATIONS

This application claims priority to U.S. Provisional Application Ser. No. 60/515,377 filed Oct. 28, 2003 and entitled "IMPROVED RADIO FREQUENCY ENVELOPE APPARATUS AND METHOD".

FIELD OF THE INVENTION

The present invention relates generally radio frequency signals, and specifically for efficient apparatus and methods for radio frequency (RF) signal transmission, reception, and modulation.

DESCRIPTION OF RELATED TECHNOLOGY

Wireless radio frequency (RF) power amplifiers are now ubiquitous, and used in any number of different devices including wireless and cellular telephones, WLAN devices, and the like. As is known, dynamically tracking the envelope of the input of such power amplifiers, and using that tracking information to control the bias level of the amplifier, has several potential benefits including, inter alia: 1) improved power added efficiency (PAE), and 2) improved linearity.

Despite their utility, the prior art envelope tracking solutions each have one or more undesirable features or deficiencies. For example, one salient deficiency common under the prior art relates to tracking the envelope of the input of the linear power amplifier in order to adjust the bias level. Specifically, the disadvantage of this scheme is that the output of the power amplifier can have a reactive load, causing phase shifts between the input and output, and causing VSWR (voltage standing wave ratio) conditions with higher voltage levels than would be found with a fixed non-reactive load. Even in the case of fixed non-reactive load, this scheme is inherently less accurate. Consider the case where the input envelope value is X volts, and the power amplifier typically has voltage gain of G, thereby making the output $Y=X*(10^{(G/20)})$. Note that the desired output voltage Y (to be controlled by the input voltage X) is related through the gain factor G. Typical devices have absolute gain errors (i.e., from device to device), and also vary with respect to environmental conditions (e.g., power supply, temperature, etc). Thus the output voltage Y is less accurately controlled using this approach.

Furthermore, under many prior art approaches, an RF isolator is commonly used between the linear power amplifier (PA) and the duplexer in order to protect the power amplifier from destruction from avalanche breakdown when a high VSWR condition exists. This RF isolator is typically quite bulky, and adds expense to the circuit as well as reduces its reliability. Ideally, RF equipment manufacturers (especially those of mobile devices such as cellular handsets) would like to eliminate such isolators from their designs.

Hence, there is a significant need to provide an effective, reliable, and low-cost apparatus and methods for envelope tracking within an RF circuit. Such improved apparatus and methods would provide for the accurate control of the output voltage, thereby increasing the efficiency and linearity margin, as well as mitigating VSWR conditions and eliminating the isolator.

SUMMARY OF THE INVENTION

The present invention satisfies the foregoing needs by providing improved apparatus and methods for envelope tracking within an RF circuit.

In a first aspect of the invention, an improved RF transmitter circuit apparatus is disclosed. In one embodiment, the apparatus comprises: a transmit upconverter; an envelope tracking apparatus operatively coupled to the output of the transmit upconverter and adapted to generate a signal based at least in part on the output; a power supply modulator adapted to selectively modulate its output based at least in part on the signals; and a power amplifier (PA), the PA driven at least in part by the output of the power supply modulator. In another embodiment, the envelope tracking apparatus receives its input from the output of the PA.

In a second aspect of the invention, an improved envelope tracking circuit apparatus is disclosed. In the exemplary embodiment, the apparatus generally comprises a plurality of transistors, such as p-channel MOS transistors, arranged in a pull-down configuration. Variable current and capacitance values are provided within the circuit in order to control its response.

In another embodiment, the envelope tracking circuit comprises: an input node; an output node; an input circuit stage coupled to the input node for comparing a signal appearing at the input node to a signal appearing at the output node; and an output circuit stage coupled to the input circuit stage for modifying the signal appearing at the output node based upon the comparison.

In a third aspect of the invention, an improved method of operating an RF transmitter circuit utilizing envelope tracking is disclosed. The method generally comprises: first receiving digital in-phase and quadrature signals; inputting the positive and negative I and Q components to transmit upconversion apparatus; producing an output signal from the upconversion apparatus; detecting the voltage level across the output of the upconversion apparatus; and feeding back the voltage level to a bias regulator (power supply modulator) to control the output thereof. In the exemplary embodiment, the modulated output is then fed to a power amplifier or other comparable device in order to generate an RF analog output which may then be fed to an antenna or additional signal path components (such as a SAW filter).

Embodiments of the present invention may be utilized in, for example, an improved RF transmitter apparatus comprising: a baseband digital processor; transmit upconverter, a power amplifier circuit, and an antenna. Such a digital baseband processor may generate digital in-phase and quadrature data streams input to the upconverter, the latter including or being coupled to an envelope tracker embodiment of the present invention adapted to modulate power applied to the amplifier according to an envelope tracking scheme. This approach increases both the linearity and power efficiency of the amplifier.

BRIEF DESCRIPTION OF THE DRAWINGS

The features, objectives, and advantages of the invention will become more apparent from the detailed description set forth below when taken in conjunction with the drawings, wherein:

FIG. 9 is graphical representation of an exemplary output waveform of the circuit of FIG. 1 after the filter.

FIG. 10 is a logical flow diagram illustrating an exemplary method of operating an RF circuit utilizing envelope tracking according to an embodiment of the invention.

DETAILED DESCRIPTION OF THE INVENTION

Reference is now made to the drawings wherein like numerals refer to like parts throughout.

As used herein, the term "wireless" refers generally to any system or components which transfer energy and/or information via a wave (e.g., electromagnetic radiation such as radio waves or microwaves).

As used herein, the term "code division multiple access," or CDMA, generally refers to digital wireless technology that uses a spread spectrum technique to disperse a signal across a wide range or band of frequencies, such as according to a pseudo-noise or other code.

As used herein, the term "upconversion" refers to any process whereby a lower frequency signal is converted to a higher frequency signal, including without limitation conversion from baseband to an intermediate frequency (IF), and conversion from baseband to carrier frequency.

Overview

Embodiments of the present invention provide, inter alia, improved apparatus and methods for envelope tracking within a wireless (or even wired) system. In one aspect, the apparatus provides dynamic tracking of the envelope of the input (or output) of a power amplifier in order to, inter alia, control the bias level of a power amplifier. As will be readily appreciated, this capability has several benefits, including for example: 1) improved power added efficiency (PAE), and 2) improved linearity.

Furthermore, it will be appreciated that the invention is also applicable to any system using a linear power amplifier or other comparable structure, whereby such systems are made able to control the output voltage more accurately, thus increasing the efficiency and linearity margin, as well as mitigating VSWR conditions, and eliminating the isolator. The invention may be applied to other architectures as well.

It will also be recognized that while cast primarily in terms of a transmitter architecture, the various aspects of the present invention may be readily adapted to a receiver/transceiver architecture with equal success by those of ordinary skill in the RF architecture field when provided the present disclosure.

Apparatus and Methods

Referring now to FIGS. 1*a*-10, first embodiments of the RF transmitter circuit apparatus and envelope tracking apparatus (and methods) of the invention are described.

It will be appreciated that while the terms "track", "tracker" and "tracking" are used in conjunction with the disclosed apparatus and methods, the apparatus and methods have functionality beyond merely tracking in the classical sense, as will be further described subsequently herein.

It will further be appreciated that while described in the context of the foregoing exemplary wireless communications system, the present invention is not so limited, and may be utilized within a variety of different applications readily apparent to those of ordinary skill in the art provided the present disclosure. The following embodiments are therefore merely illustrative of the broader principles of the invention.

Figure 1A:
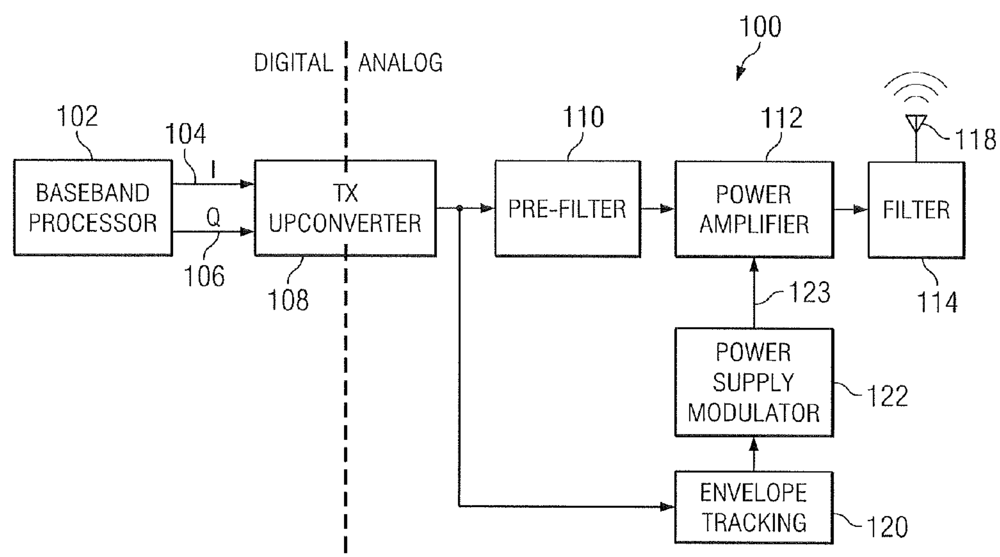
FIG. 1*a* is a functional block diagram of a first exemplary embodiment of the RF circuit apparatus with envelope tracking according to the invention.

Referring to FIG. 1*a*, a first exemplary embodiment of an RF transmitter circuit with envelope tracking according to the invention is shown. The apparatus 100 of FIG. 1*a* shows a baseband processor 102 (such as a DSP, RISC-based device, microprocessor, array processor, or other digital processing circuit), the output of which comprises digital I-channel 104 and digital Q-channel 106 data streams (so-called "digital I and Q" of the type well known in the communications arts). These high-speed digital I and Q data streams are input to a transmitter upconversion circuit 108 to produce the desired RF modulated waveform. The transmitter (Tx) upconversion circuit 108 may include any number of different functions well known to those of ordinary skill in the RF arts, including digital-to-analog converter(s) (DACs), VCO, mixers, heterodyning circuits, etc.). The upconversion circuit 108 both (a) converts the digital I and Q values to analog representations thereof, and (b) converts these baseband signals to a higher frequency; e.g., the ultimate carrier frequency of the signal transmitted over the antenna 118. The analog output of the Tx upconverter circuit 108 is optionally filtered via a pre-filter 110 in order to remove unwanted (e.g., out of band) signal components, and then amplified via a power amplifier 112. The amplified signal is then again optionally filtered (via the filter 114) in order to remove unwanted artifact introduced by, inter alia, the amplifier 112, and then transmitted over the antenna 118.

It will be appreciated that while the present embodiment is cast in terms of a typical CDMA (e.g., IS-95, CDMA2000, Wideband CDMA, etc.) wireless system operating at, for example a nominal frequency of 1.8 GHz or 2.4 GHz, the principles disclosed herein may be readily applied to other frequency ranges and air interface architectures.

Referring again to FIG. 1*a*, an envelope tracking circuit 120 monitors the output of the Tx upconverter 108. It will be recognized that the output of the pre-filter 110 may also be utilized for this purpose as well, either alone or in combination with the illustrated components; e.g., with a second envelope tracker (not shown) to provide for example redundancy or other complementary functions such as where one tracker circuit is used to address one "portion" of the waveform, and as second heterogeneous tracker circuit is used to address another. The outputs of the two locations (i.e., before and after the filter 110) can also be averaged or otherwise combined.

As another option, the envelope detector 120 can be configured as two peak detectors (not shown) to detect both the rising and falling 'peaks'. In many cases, it may be desired to configure the peak detector so as to have larger attack current and a small decay current. Thus by using two peak detectors, the envelope of the waveform is tracked more closely than the single peak detector implementation, as somewhat of a tradeoff for increased complexity. Furthermore, it will be recognized that even greater numbers of envelope detectors may be utilized if desired, again trading off for increased complexity, reduced spatial efficiency, etc.

The output of the envelope tracking circuit 120 comprises the envelope of the RF modulated and upconverted waveform. This envelope output is used to control the power supply modulator 122, the latter which outputs a power supply voltage 123 proportional to the input envelope waveform.

In the event of worst case VSWR reflection, when the output voltage of the PA 112 (or the filter 110) is at highest level, and the bias regulator (modulator 122) is also at the highest level, the tracking circuit 120 of the present invention is advantageously configured to avoid damage. Specifically, the external event causing the VSWR reflection is typically slow (in the millisecond range) as compared with the electronics, in particular since the envelope tracking circuit 120 can track the envelope waveform in the tens and even hundreds of MHz; hence, the circuit 120 has more than sufficient time to detect the VSWR over voltage conditions and feedback to the power supply modulator 122 to reduce the output voltage of the filter 10 or the PA 112 to negate the effect of VSWR. This is yet another desirable feature of the illustrated embodiment.

It will be recognized that while the aforementioned VSWR conditions will often occur at the output of the PA 112 (due to, e.g., varying impedance conditions at the antenna or other downstream components), these conditions may also be propagated back through the PA 112 to its input (and hence the output of the filter 110 and even the TX upconverter 112).

Figure 1B:
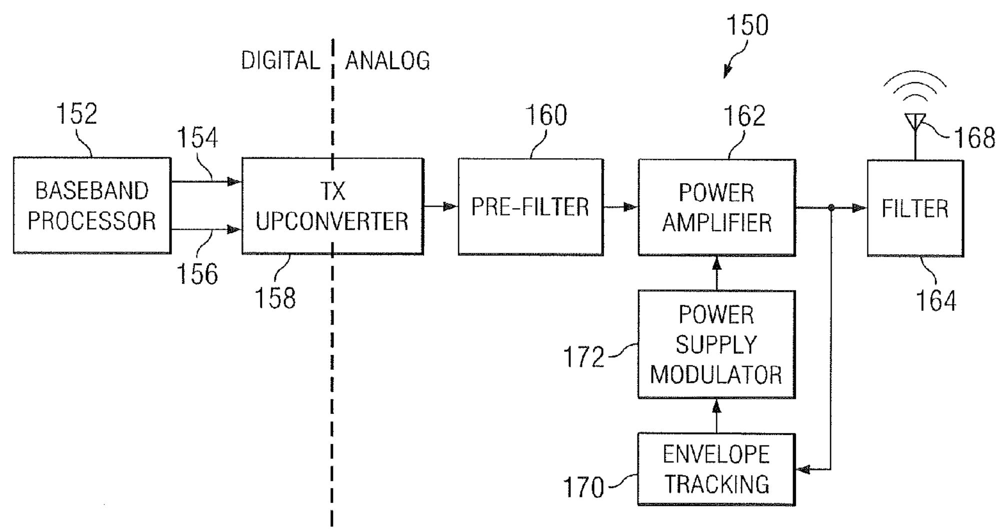
FIG. 1*b* is a functional block diagram of a second exemplary embodiment of the RF circuit apparatus with envelope tracking according to the invention.

Referring now to FIG. 1*b*, a second exemplary embodiment of an RF transmitter circuit with envelope tracking according to the invention is shown. The apparatus 150 of FIG. 1*b* shows a baseband processor 152 (such as a DSP, RISC-based device, microprocessor, array processor, or other digital processing circuit), the output of which comprises digital I-channel 154 and digital Q-channel 156 data streams (so-called "digital and Q" of the type well known in the communications arts). These high-speed digital I and Q data streams are input to a transmitter upconversion circuit 158 to produce the desired RF modulated waveform. The transmitter (Tx) upconversion circuit 158 may include any number of different functions well known to those of ordinary skill in the RF arts, including digital-to-analog converter(s) (DACs), VCO, mixers, heterodyning circuits, etc.). As in the circuit 100 of FIG. 1*a*, the upconversion circuit 158 both (a) converts the digital I and Q values to analog representations thereof, and (b) converts these baseband signals to a higher frequency; e.g., the ultimate carrier frequency of the signal transmitted over the antenna 168. The analog output of the Tx upconverter circuit 158 is optionally filtered via a pre-filter 160 in order to remove unwanted (e.g., out of band) signal components, and then amplified via a power amplifier 162. The amplified signal is then again optionally filtered (via the filter 164) in order to remove unwanted artifact introduced by, inter alia, the amplifier 162, and then transmitted over the antenna 168. However, in the circuit 150 of FIG. 1*b*, the output of the amplifier 162 (or even the filter 164) is used as the basis for the input to the envelope tracker 170, and hence the amplifier 162 (or amplifier 162 and filter 164), tracker circuit 170, and power supply modulator 172 form a feedback loop of sorts to control the output voltage of the power amplifier 162.

It will be recognized that while FIGS. 1*a* and 1*b* are cast in terms of a plurality of substantially discrete components, any two or more of these components may be combined, such as e.g., into a single SoC IC device. For example, it may be desirable to integrate the Tx upconversion, filtering, and power amplifier functions (as well as envelope tracking and modulator function) into a single IC die for space and power conservation considerations. Myriad other combinations of these functions are possible as well.

It is understood that the RF transmitter circuits of FIGS. 1*a* and 1*b* may be utilized in a telecommunications system having RF communication capabilities, such as for example a cellular telephone, PDA, handheld computer, or laptop computer. As is known in the art, such a device (e.g., cellular telephone) may also include a number of other components including an RF receiver, a battery or other power source, and a keypad or other comparable device for receiving user input.

Figure 2:
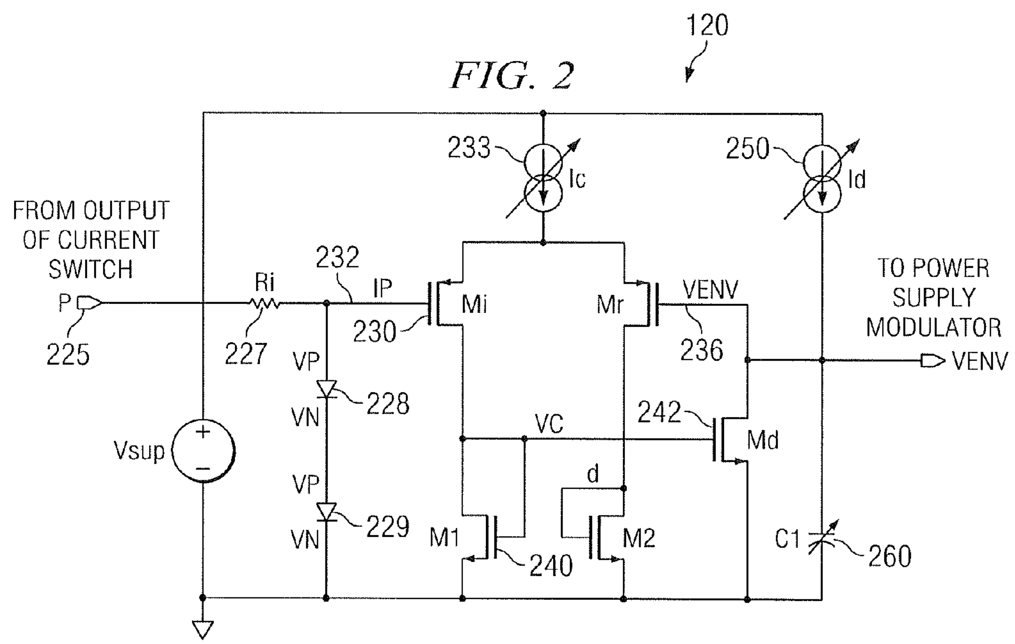
FIG. 2 is a schematic diagram of an envelope tracking circuit according to an exemplary embodiment of the invention.

Referring now to FIG. 2, an exemplary transistor-level implementation of the envelope tracking circuit 120 of FIG. 1*a* is described. At the output of the PA 112 (or filter 114), the voltage level can vary significantly, e.g., as high as 14V in the event of an VSWR reflection. Thus an input resistor $R_i$ 227 and two diodes 228, 229 are used to limit the upper limit swing for the gate input of the MOS transistor device 230. In the illustrated embodiment, the MOS device 230 comprises a PMOS FET device of the type known in the art, although it will be appreciated that other types of MOS devices (e.g., NMOS) and in fact non-MOS devices may be utilized within the apparatus 120.

If the voltage of node 232 at the gate terminal of transistor 230 is lower than the voltage on reference node 236, then transistor 230 will pass a current (approximately $I_a$) from current source 233 to the load transistor 240, which in turns causes a pull-down transistor device $M_d$ 242 to lower the voltage at reference node 236.

Alternatively, if the voltage at node 232 is higher than the voltage of reference node 236, then transistor 230 is turned OFF, which causes the pull-down transistor device 242 to be turned OFF as well. The voltage at node 236 is slowly charged up to a higher voltage value by the current source $I_d$ 250.

Thus, $I_a$ (the "attack" current) from current source 233 controls the rate at which the node 236 reaches the lower waveform (so-called "trough" of the waveform) value, and $I_d$ (the "decay" current) from current source 250 controls the node 236 to restore the waveform value before the trough. Capacitor $C_1$ 260 filters out the higher frequency content, and outputs the lower frequency envelope signal $V_{env}$.

It is understood that the envelope detector 120 may be implemented with transistor components other than FETs, such as bipolar transistors.

Figure 3:
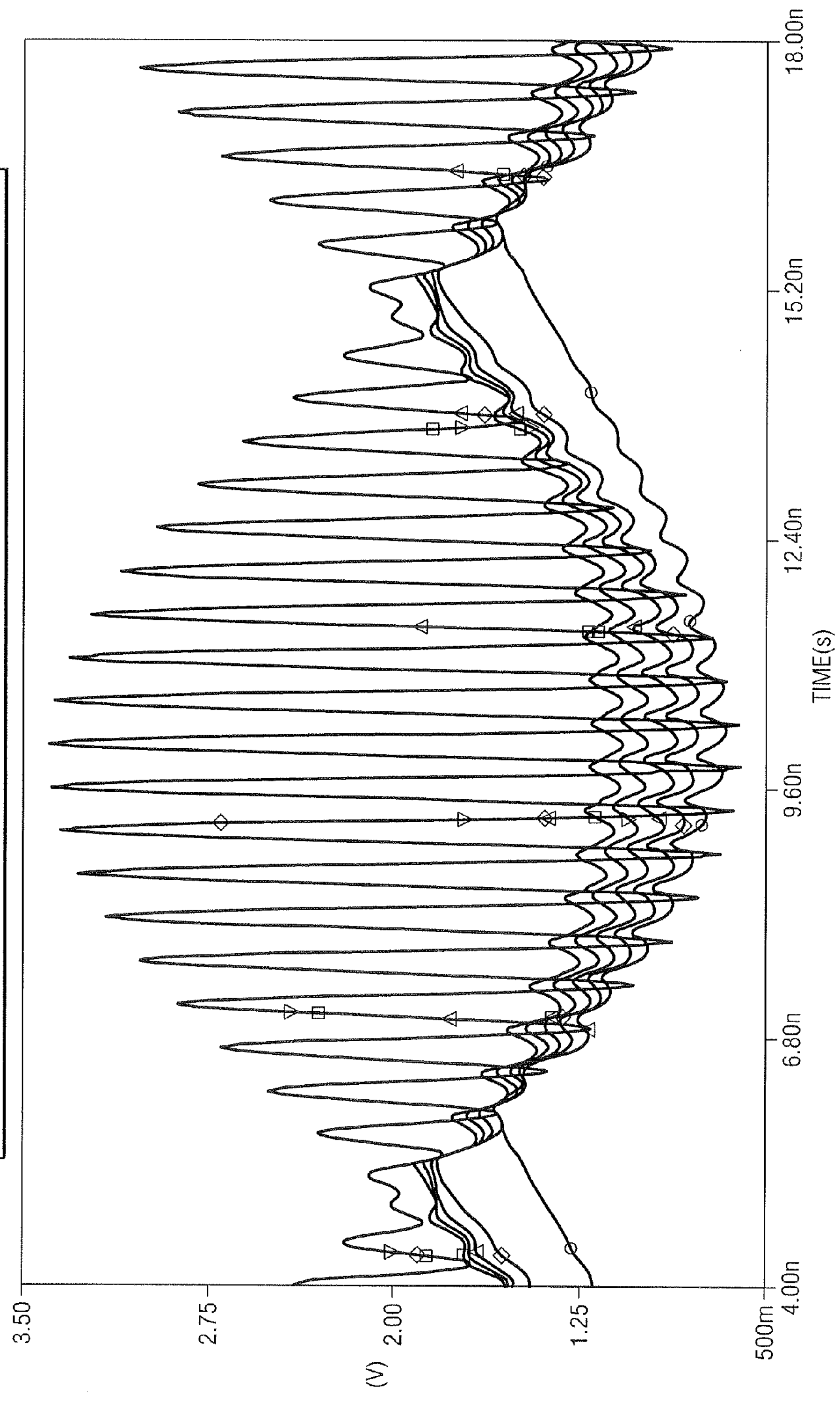
FIG. 3 is graphical representation of the output voltage as a function of time produced by the exemplary envelope tracking circuit of FIG. 2 for various decay currents.
Figure 4:
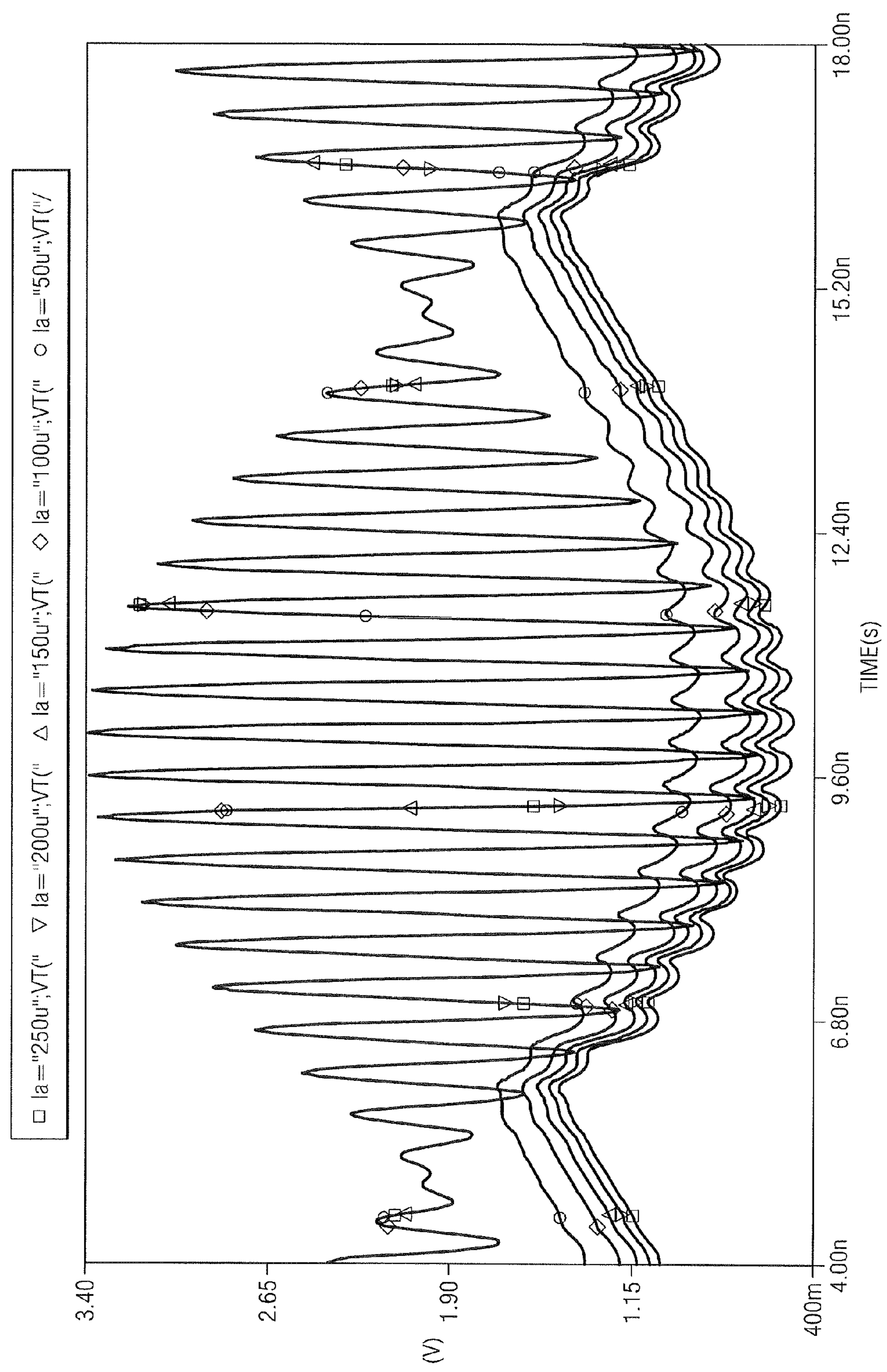
FIG. 4 is graphical representation of the output voltage as a function of time produced by the exemplary envelope tracking circuit of FIG. 2 for various attack currents.

Referring to FIGS. 3 and 4, the circuit parameters $I_a$, $I_d$, and $C_1$ substantially control the tracking of the input waveform envelope according to the following equation:

$$dV/dT=I/C \quad \text{Eqn. (1)}$$

where dV/dT is the rate of the change of the envelope (voltage), and I comprises the attack and decay currents controlling the attack and decay slopes of the waveform, respectively. Specifically, during the "attack" phase of the waveform, the current of Eqn. (1) above will comprise $I_a$. Similarly, during the "decay" phase of the waveform, the current of Eqn. (1) above will comprise $I_d$.

For different modulation schemes and data rates, the foregoing parameters can be adjusted by, e.g., programming the $I_a$, $I_d$, and $C_1$ parameter values, respectively. Accordingly, these values are shown as variable elements (i.e., arrows) on the schematic of FIG. 2. Other schemes of adjusting and controlling one or more of these parameters may be used as well, such as adjusting their values based on other related or unrelated parameters. Such adjustments may be made programmatically during operation (e.g., via an algorithm, hardware, or other such control function), or alternatively set before time of operation as desired.

To illustrate the operation of the exemplary envelope tracker 120 of FIG. 2, a simple two-tone test signal (2 GHz and 2.1 GHz) was used. The nominal values of the circuit parameters in the illustration of FIG. 3 are $I_a$=100 μA, $I_d$=10 μA and $C_1$=20 fF (open looped configuration). In closed loop configuration (where the closed loop simulation results/plots were produced) the capacitor ($C_1$) value used is 2 pF.

The exemplary envelope tracker 120 generally operates in open-loop mode during operation. FIG. 3 shows the envelope tracker output signal when the decay current $I_d$ is changed from 10 μA to 50 μA in 10 μA increments. It is noted that at large decay current values, the circuit 120 tracks small input signal amplitude values (e.g., near the time axis value of 15.2 ns in the illustration of FIG. 3) better. However, this also limits the ability to reach the trough value (near 9.6 ns in FIG. 3).

The effects of the "attack" current $I_a$ is shown FIG. 4, where its value is changed from 50 μA to 250 μA in 50 μA steps. Note that at large current values, the circuit 120 tracks the trough faster as compared to the response of FIG. 3. However, too large of a $I_a$ current value can cause overshoot, and resulting the envelope value being lower than the actual waveform trough (i.e., near the 9.6 ns point on the Figure). Also, larger $I_a$ attack current values depart further from the small input signal amplitude value (i.e., near 15.2 ns on the time axis).

The effect of making the capacitor $C_1$ larger is to reduce both the rate of the attack and decay by the relationship of Eqn. 1; i.e., dV/dT=I/C.

In selecting an optimal configuration, several considerations exist, including: i) how much overshoot/undershoot of the trough can be tolerated; ii) how much overshoot/undershoot of the peak can be tolerated; and iii) when both attack and decay currents are large, the slope/step of the attack/decay are large, this causes larger ripple in the envelope value—how much ripple can be tolerated. Each of the foregoing values would then be dependent on the characteristics of the waveform, and the characteristics of the waveform are dependent upon, e.g., the modulation scheme (or the wireless application and standard). However, it will be recognized that the attack and decay currents, and the capacitance value, can be readily configured, programmed or adjusted to produce an "optimal solution" (whether such solution is static, or alternatively dynamic and variable in nature).

Figure 5:
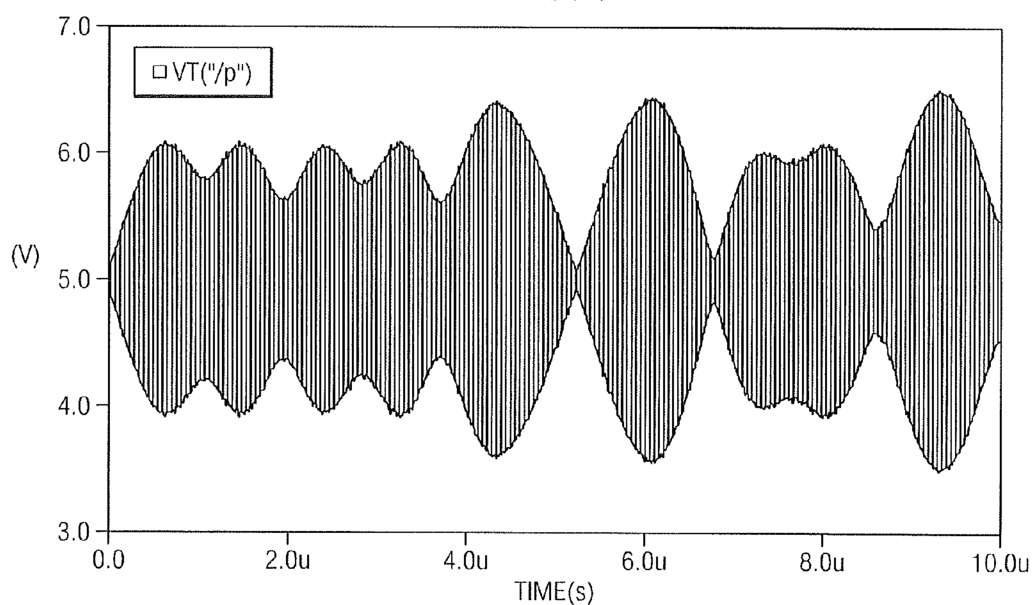
FIG. 5 is graphical representation of an exemplary waveform derived from the output of the transmit upconversion apparatus of FIG. 1, based on a fixed power supply voltage of 5V.

FIG. 5 illustrates an exemplary waveform derived from the output of the Tx upconverter 108 (or filter 110) (see FIG. 2) with the envelope tracking circuit 120 disabled, based on a fixed power supply voltage of 5V (which may be varied as desired).

Figure 6:
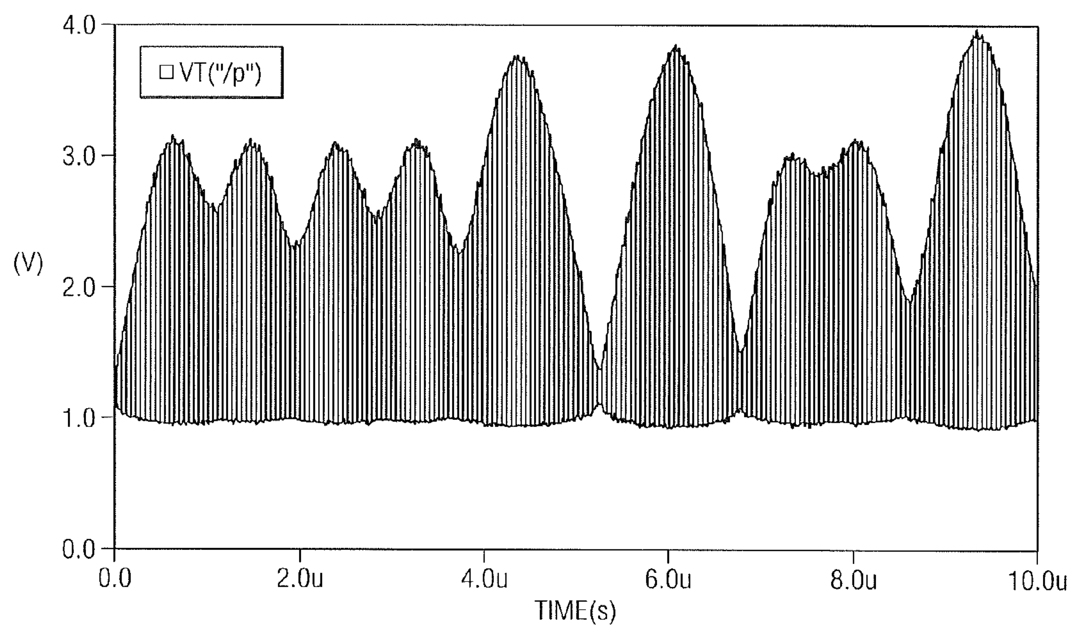
FIG. 6 is graphical representation of an exemplary waveform derived from the output of the transmit upconversion apparatus of FIG. 1, with the envelope tracker circuit enabled to control the power supply modulator.

FIG. 6 illustrates an exemplary waveform derived from output of the Tx upconverter or filter (i.e., input of envelop tracker circuit 120), with the envelope tracker circuit 120 enabled to control the power supply modulator 122. As shown in FIG. 6, the envelope tracker circuit 120, along with the power supply modulator 122, controls and sets the minimum voltage level at the output of the upconverter/filter to be about 1V, although other values may be utilized.

Figure 7:
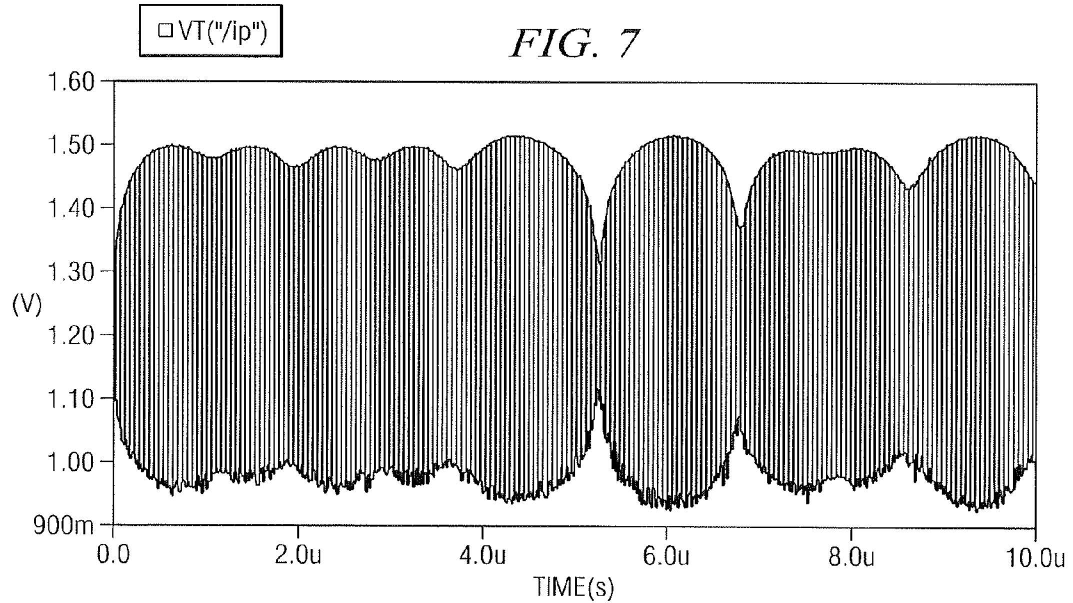
FIG. 7 is graphical representation of an exemplary waveform taken at an internal node of the tracker circuit of FIG. 2.

FIG. 7 illustrates an exemplary waveform taken at the gate input 232 to the transistor device 230. Note that this input waveform is clamped by the diode(s) 228, 229 to a maximum value of approximately 1.5V, and the minimum voltage value of 1V at the input 225 is controlled by the envelope tracker circuit 120 and power supply modulator 122.

Figure 8A:
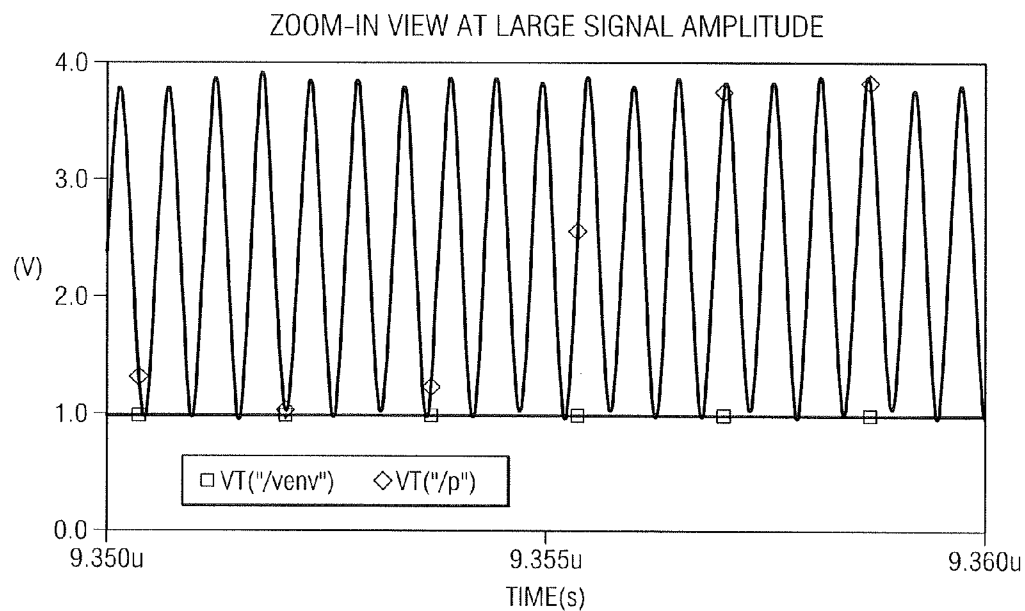
FIGS. 8*a* and 8*b* are graphical representations of exemplary input and output waveforms of the tracker circuit of FIG. 2 showing the worst-case instance of largest amplitude and smallest amplitude, respectively.
Figure 8B:
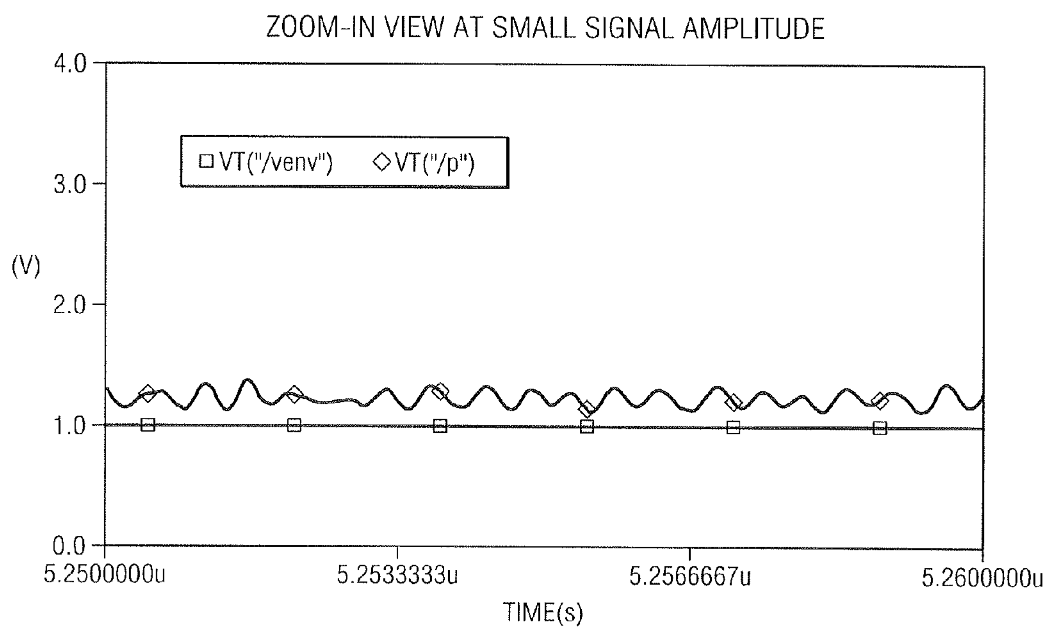

FIGS. 8*a* and 8*b* illustrate an exemplary waveform showing the worst-case instance of largest amplitude (i.e., near the 9.355 μs value on the time axis, FIG. 8*a*) and smallest amplitude (near the 5.255 μs value, FIG. 8*b*) of input node 225 and output node 236 of envelope tracking circuit 120.

It is noted that the waveform of FIG. 8*a* (showing the trough of the waveform) is controlled by the feedback loop to be approximately 1V, although other values can be substituted.

The waveform of FIG. 8*b* shows that when the input signal amplitude is small, it is controlled to be slightly above the exemplary value of 1V (this is consistent with how well the envelope tracker circuit 120 follows the input waveform trough value, and the small input signal amplitude values in FIGS. 3 and 4 discussed previously herein).

Also shown in FIGS. 8*a* and 8*b* is the closed-loop envelope tracker circuit output value VT("/$v_{env}$", or node 236). This value remains essentially constant with time, and equals approximately 1V in the illustrated embodiment because it is part of the control loop, and is compared against a reference value of 1V.

FIG. 9 illustrates the exemplary output waveform after the filter 114 of FIG. 1*a*; i.e., the input to the antenna 118. This waveform is essentially the same with and without the envelope tracker circuit 120 enabled. This is significant, since the net output of any apparatus equipped with the envelope tracking improvements described herein produces substantially identical output to similar apparatus not so-equipped, yet with greater power efficiency and linearity. The apparatus of the present invention is therefore effectively transparent to the input signal, yet provides the significant benefits described above.

Referring now to FIG. 10, there is shown an exemplary method of operation of the RF circuit 100 of FIG. 1*a*. As shown in FIG. 10, the method 1000 generally comprises first receiving digital in-phase and quadrature signals (step 1002). These may be generated by, e.g., a digital baseband processor 102 such as a DSP or System-on-Chip (SoC) device of the type well known in the art as previously described.

Next, per step 1004, the I and Q signals are input to an upconversion stage (e.g., Tx upconverter 108), thereby producing an analog output voltage at an upconverted frequency. Next, the voltage level across the output of the upconversion stage (or filter, if the filter 110 is used) is detected (step 1006), and fed to the envelope tracking circuit 120 (step 1008) wherein the input voltage envelope is "tracked" onto the output of the circuit 120 as previously described herein (step 1010). The output of the envelope tracker 120 is then used to control the bias regulator (power supply modulator) per step 1012.

The modulated output of the modulator 122 is then fed to a power amplifier 112 or other comparable device per step 1014 in order to generate an amplified RF analog output which may then be fed to an antenna or additional signal path components (such as a SAW filter 114 or the like).

As will be appreciated, the methodology of FIG. 10 can also be readily adapted to the circuit configuration of FIG. 1*b*; i.e., where the output of the PA 162 is used to feed the envelope tracker 170 (and hence modulator 172).

It will be recognized that while certain aspects of the invention are described in terms of a specific sequence of steps of a method or ordering of components in an apparatus adapted to implement the methodology of the invention, these descriptions are only illustrative of the broader invention, and may be modified as required by the particular application. Certain steps/components may be rendered unnecessary or optional under certain circumstances. Additionally, certain steps/components or functionality may be added to the disclosed embodiments, or the order of performance of two or more steps or components permuted. All such variations are considered to be encompassed within the invention disclosed and claimed herein.

While the above detailed description has shown, described, and pointed out novel features of the invention as applied to various embodiments, it will be understood that various omissions, substitutions, and changes in the form and details of the device or process illustrated may be made by those skilled in the art without departing from the invention. The foregoing description is of the best mode presently contemplated of carrying out the invention. This description is in no way meant to be limiting, but rather should be taken as illustrative of the general principles of the invention. The scope of the invention should be determined with reference to the claims.

What is claimed is:

1. Envelope tracking apparatus for use in an RF transmitter and/or receiver circuit, comprising:

an input node;

a first transistor device having a control terminal in electrical communication with said input node;

a resistor disposed electrically between said input node and said control terminal of said first transistor;

a second transistor device in electrical communication with said first device, the first and second transistor devices each having a conduction terminal coupled to a conduction terminal of the other of the first and second transistor devices;

a third transistor device in electrical communication with said first device;

a fourth transistor device having a control terminal in electrical communication with said first transistor device and said third transistor device, a conduction terminal of said fourth device being in electrical communication with a control terminal of said second device and an output node;

wherein when a first voltage applied to the input node is lower than a second voltage at said output node, said third and fourth transistor devices cooperate to lower said second voltage, said lowered second voltage substantially tracking said first voltage.

2. The apparatus of claim 1, further comprising a capacitor coupled to said output node so as to filter at least a portion of the frequencies present within said second lowered voltage.

3. The apparatus of claim 2, further comprising at least one current source coupled to said output node and adapted to raise the voltage of said output node over a period of time.

4. The apparatus of claim 2, further comprising at least one current source coupled to said first and second transistors.

5. The apparatus of claim 2, wherein a capacitance value of the capacitor is adjustable.

6. The apparatus of claim 3, wherein current passing through the at least one current source is adjustable.

7. An envelope tracking circuit for use in an RF circuit, comprising:

an input node;

a first transistor electrically coupled to said input node;

an output node;

a second transistor electrically coupled to said output node and said first transistor; and first and second current sources, said first current source coupled to said first and second transistors, said second current source coupled to said output node;

wherein said first and second current sources substantially control the tracking by an output waveform envelope generated at said output node of an input waveform envelope applied to said input node.

8. The circuit of claim 7, further comprising a capacitor coupled to said output node; and wherein said capacitor and said first and second sources control said tracking according to the following relationship:

$$dV/dt=I/C$$

where I comprises the currents produced by said first and second sources during first and second portions of said input waveform envelope, respectively, C is the capacitance of the capacitor, and V is the voltage across the capacitor.

9. The circuit of claim 7, wherein said first current source substantially controls the rate at which said output waveform achieves a trough voltage of said input waveform.

10. The circuit of claim 9, wherein said second current source substantially causes said output waveform to recover from said trough voltage of said input waveform.

11. The circuit of claim 8, wherein said first current source substantially lowers said output waveform during a trough voltage of said input waveform, and said second current source substantially raises said output waveform during portions of said input waveform.

12. Envelope tracking apparatus for use in at least one of an RF transmitter or receiver circuit, comprising:

an input node;

a first transistor device having a control terminal coupled to said input node;

an output node;

a second transistor device coupled to said first transistor device, said second transistor device having a control terminal coupled to said output node; and a third transistor device coupled to said output node and said control terminal of said second transistor device;

wherein said first, second and third transistor devices cooperate to substantially track the signal at said output node to the signal applied to said input node.

13. The apparatus of claim 12, wherein a conduction terminal of the second transistor device is coupled to a conduction terminal of the first transistor device.

14. The apparatus of claim 12, wherein a control terminal of the third transistor device is coupled to a conduction terminal of the first transistor device.

15. The apparatus of claim 12, further comprising a first current source coupled to the conduction terminals of the first and second transistor devices.

16. The apparatus of claim 15, further comprising and a second current source coupled to the output node.

17. The apparatus of claim 12, wherein said first and second transistor devices are in substantially mirror-image configuration within said apparatus between said input node and said output node.

18. The apparatus of claim 12, wherein when said voltage applied to the input node is lower than said voltage existing at said output node, said third transistor device is operative to lower said output node voltage.

19. The apparatus of claim 18, further comprising a fourth transistor device in communication with one of the emitter or collector of said first device, said one of the emitter or collector further being in communication with the base of said third device.

20. The apparatus of claim 18, further comprising a capacitor coupled to said output node, said capacitor substantially filtering at least one frequency band from said voltage at said output node.

21. An envelope tracking circuit for use in an RF circuit, comprising:

an input node;

a first transistor electrically coupled to said input node;

an output node;

a second transistor electrically coupled to said output node and said first transistor; and first and second current sources, said first current source coupled to said first and second transistors, said second current source coupled to said output node;

wherein said first and second current sources are utilized in controlling the tracking by an output waveform envelope generated at said output node of an input waveform envelope applied to said input node; and wherein currents provided by said first and second current sources are controlled substantially according to a plurality of control parameters.

22. The circuit of claim 21, further comprising a capacitor coupled to said output node; and wherein said capacitor and said first and second sources control said tracking according to the following relationship:

$$dV/dt=I/C$$

where I comprises current values produced by said first and second sources based at least in part on said control parameters during first and second portions of said input waveform envelope, respectively, and C comprises a capacitance value of said capacitor.

23. Envelope tracking apparatus for use in an RF communication device, comprising:

an input node;

a first switching means in electrical communication with said input node;

an output node;

a second switching means in electrical communication with said first device, said second device in electrical communication with said second node; and a third switching means in electrical communication with said output node and said second device;

wherein said first, second and third switching means cooperate to substantially match the voltage generated at said output node to the voltage applied to said input node.

* * * * *